US012563685B2

(12) United States Patent
Zhang

(10) Patent No.: US 12,563,685 B2
(45) Date of Patent: Feb. 24, 2026

(54) HERMETICALLY SEALED ELECTRICAL CONNECTION

(71) Applicant: FISHER CONTROLS INTERNATIONAL LLC, Marshalltown, IA (US)

(72) Inventor: Lei Zhang, Singapore (SG)

(73) Assignee: FISHER CONTROLS INTERNATIONAL LLC, Marshalltown, IA (US)

( * ) Notice: Subject to any disclaimer, the term of this patent is extended or adjusted under 35 U.S.C. 154(b) by 675 days.

(21) Appl. No.: 18/165,312

(22) Filed: Feb. 6, 2023

(65) Prior Publication Data

US 2024/0268049 A1 Aug. 8, 2024

(51) Int. Cl.
*H05K 5/06* (2006.01)

(52) U.S. Cl.
CPC ............. *H05K 5/069* (2013.01); *H05K 5/064* (2013.01)

(58) Field of Classification Search
CPC .......... H05K 5/069; H05K 5/064; H05K 5/06; H05K 5/30; H05K 5/0217; H05K 5/065; H01B 17/301; H01B 17/30; H01B 19/00; H01B 1/00; H02G 1/00; H02G 3/22; H01R 13/46; H01R 13/5219; H01R 13/53
USPC ................ 174/650, 520, 50.5, 50.51, 138 R, 174/152 GM, 14 BH, 152 G, 153 G, 174/152 R, 137 R, 151; 16/2.1, 2.2; 277/312, 314
See application file for complete search history.

(56) References Cited

U.S. PATENT DOCUMENTS

| | | | | |
|---|---|---|---|---|
| 6,867,368 B2 * | 3/2005 | Kumar | ................ | H01S 5/02212 174/650 |
| 7,652,892 B2 * | 1/2010 | Shiu | ........................ | H05K 5/064 361/752 |
| 7,763,808 B2 * | 7/2010 | Tolbert, Jr. | ............... | H02G 3/22 174/650 |
| 9,148,968 B2 * | 9/2015 | Sone | ....................... | H05K 5/065 |
| 9,196,303 B2 * | 11/2015 | Hirano | ............... | H01R 13/5202 |
| 9,431,759 B2 * | 8/2016 | Hirano | ................. | G11B 33/122 |
| 10,559,408 B2 * | 2/2020 | Sprengers | ............ | G02B 6/4248 |
| 12,431,267 B2 * | 9/2025 | Fritz | ........................ | H02G 3/22 |
| 12,456,562 B2 * | 10/2025 | Bellora | ................ | H02G 15/013 |

OTHER PUBLICATIONS

Hardman Technical Information Bulletin EPOCAP Epoxy Encapsulation System, Royal Adhesives and Sealants, LLC, ISO 9001:2008.

* cited by examiner

*Primary Examiner* — Angel R Estrada
(74) *Attorney, Agent, or Firm* — Mackey Law Firm PLLC

(57) ABSTRACT

A feedthrough apparatus, such as for a passage through a barrier between a first compartment and a second compartment of a housing, can include a sleeve configured to sealingly couple with the passage, a printed circuit board (PCB) disposed through the sleeve and configured to provide electrical communication among the first compartment and the second compartment of the housing, and a seal disposed within the sleeve. The seal can be sealingly coupled to the PCB, and the sleeve, the PCB and the seal can be configured to hermetically seal the passage. The seal can include potting material and a V-groove connection.

20 Claims, 9 Drawing Sheets

HERMETICALLY SEALED ELECTRICAL CONNECTION

CROSS REFERENCE TO RELATED APPLICATIONS

Not applicable.

STATEMENT REGARDING FEDERALLY SPONSORED RESEARCH OR DEVELOPMENT

Not applicable.

REFERENCE TO APPENDIX

Not applicable.

BACKGROUND OF THE INVENTION

Field of the Invention

The present disclosure relates generally to process controls and more specifically relates to process control devices for use in hazardous environments.

Description of the Related Art

Process control devices for use in hazardous environments often use hermetic seals between spaces that could contain explosive materials and electrical systems, such as valve controllers. In some cases, coupling devices utilize potting materials to provide hermetically sealed electrical connections. However, these coupling devices can be exposed to significant forces and current designs may not be ideal for some applications.

BRIEF SUMMARY OF THE INVENTION

Applicant has created new and useful devices, systems and methods for providing a hermetically sealed electrical connection through a passage in a barrier between a first compartment and a second compartment of a housing.

In at least one embodiment, a feedthrough apparatus, such as for a passage through a barrier between a first compartment and a second compartment of a housing, can include a sleeve configured to sealingly couple with the passage, a printed circuit board (PCB) disposed through the sleeve and configured to provide electrical communication among the first compartment and the second compartment of the housing, and a seal disposed within the sleeve. In at least one embodiment, the sleeve can include a first end, a second end longitudinally opposite the first end, and a bore extending there between. In at least one embodiment, the PCB can be disposed through the bore of the sleeve. In at least one embodiment, the seal can be disposed within the bore of the sleeve. In at least one embodiment, the seal can have a first end configured to be disposed in fluid communication with the first compartment and a second end configured to be disposed in fluid communication with the second compartment. In at least one embodiment, the seal can be sealingly coupled to the PCB. In at least one embodiment, the feedthrough apparatus can have a first sealing section, wherein an exterior sealing surface of the seal can be in sealing engagement with an interior sealing surface of the bore.

In at least one embodiment, the sleeve, the PCB and the seal can be configured to hermetically seal the passage. In at least one embodiment, the seal can include an epoxy, a potting material, an encapsulant, or any combination thereof.

In at least one embodiment, the bore can include a first internal groove that opens towards the first end of the sleeve. In at least one embodiment, the seal can include a tongue sealingly coupled to the first internal groove. In at least one embodiment, the first internal groove can be a V groove. In at least one embodiment, the bore can include one or more internal annular grooves disposed longitudinally between the first internal groove and the second end of the sleeve. In at least one embodiment, the seal can sealingly engage one or more of the internal annular grooves.

In at least one embodiment, a cross-sectional area of the seal can decrease along the first sealing section in a direction from the first end of the seal to the second end of the seal. In at least one embodiment, a cross-sectional area of the bore can decrease along the first sealing section in the direction from the first end of the sleeve to the second end of the sleeve. In at least one embodiment, a surface area of the first end of the seal in fluid communication with the first compartment can be larger than a surface area of the second end of the seal in fluid communication with the second compartment.

In at least one embodiment, the first sealing section can be frustoconical. In at least one embodiment, the bore can include a plurality of internal frustoconical sections. In at least one embodiment, the seal can sealingly engage one or more of the internal frustoconical sections.

In at least one embodiment, the feedthrough apparatus can also include a second sealing section. In at least one embodiment, a second exterior sealing surface of the seal can be in sealing engagement with a second interior sealing surface of the bore. In at least one embodiment, the second sealing section can be disposed between the first sealing section and the first end of the seal. In at least one embodiment, the second sealing section can have a major cross-sectional dimension larger than a major cross-sectional dimension of the first sealing section. In at least one embodiment, the second sealing section, or a portion thereof, can be frustoconical.

In at least one embodiment, the first end of the sleeve can include an interior annular step. In at least one embodiment, the second end of the sleeve can include an interior conical section. In at least one embodiment, the bore can include a plurality of internal annular grooves disposed longitudinally between the step and the conical section. In at least one embodiment, the seal can sealingly engage the step, the conical section, the grooves, or any combination thereof.

In at least one embodiment, the sleeve can include a flange configured to abut the barrier, an external seal groove disposed in an exterior surface of the sleeve, an external seal seated in the external seal groove, or any combination thereof. In at least one embodiment, the sleeve can be configured to sealingly engage an internal surface of the passage.

In at least one embodiment, a digital valve controller can include a housing having a first compartment, a second compartment, a barrier between the first and second compartments, and a passage through the barrier, and a feedthrough apparatus coupled to the passage. In at least one embodiment, the feedthrough apparatus can include a sleeve having a first end, a second end longitudinally opposite the first end, and a bore extending there between, a PCB disposed through the bore of the sleeve and configured to provide electrical communication among the first compartment and the second compartment of the housing, and a seal disposed within the bore of the sleeve. In at least one embodiment, the seal can have a first end in fluid communication with the first compartment and a second end in fluid communication with the second compartment. In at least one embodiment, the feedthrough apparatus can include a first sealing section with an exterior sealing surface of the seal being in sealing engagement with an interior sealing surface of the bore. In at least one embodiment, the sleeve can be sealingly coupled with the passage. In at least one embodiment, the seal can be sealingly coupled with the PCB. In at least one embodiment, the bore can include a first internal groove that opens towards the first end of the sleeve. In at least one embodiment, the seal can include a tongue sealingly coupled to the first internal groove. In at least one embodiment, the sleeve, the PCB and the seal can hermetically seal the passage.

In at least one embodiment, the first internal groove can be a V groove. In at least one embodiment, the bore can have one or more internal annular grooves, such as disposed longitudinally between the first internal groove and the second end of the sleeve. In at least one embodiment, the seal can sealingly engage one or more of the internal annular grooves. In at least one embodiment, the bore can have a plurality of internal frustoconical sections. In at least one embodiment, the seal can sealingly engage each one or more of the internal frustoconical sections.

In at least one embodiment, the seal can include at least one of an epoxy, a potting material, an encapsulant, or any combination thereof. In at least one embodiment, a surface area of the first end of the seal in fluid communication with the first compartment can be larger than a surface area of the second end of the seal in fluid communication with the second compartment.

In at least one embodiment, a cross-sectional area of the seal can decrease along the first sealing section in a direction from the first end of the seal to the second end of the seal. In at least one embodiment, a cross-sectional area of the bore can decrease along the first sealing section in the direction from the first end of the sleeve to the second end of the sleeve. In at least one embodiment, the first sealing section can be frustoconical.

The feedthrough apparatus can also include a second sealing section wherein a second exterior sealing surface of the seal can be in sealing engagement with a second interior sealing surface of the bore. In at least one embodiment, the second sealing section can be disposed between the first sealing section and the first end of the seal. In at least one embodiment, the second sealing section can have a major cross-sectional dimension larger than a major cross-sectional dimension of the first sealing section. In at least one embodiment, the second sealing section, or a portion thereof, can be frustoconical.

In at least one embodiment, the first end of the sleeve can have an interior annular step. In at least one embodiment, the second end of the sleeve can have an interior conical section. In at least one embodiment, the bore can include a plurality of internal annular grooves disposed longitudinally between the step and the conical section. In at least one embodiment, the seal can sealingly engage the step, the conical section, the grooves, or any combination thereof.

In at least one embodiment, the sleeve can include a flange configured to abut the barrier, an external seal groove disposed in an exterior surface of the sleeve, an external seal seated in the external seal groove, or any combination thereof. In at least one embodiment, the sleeve can sealingly engage an internal surface of the passage.

In at least one embodiment, a method of providing a hermetically sealed electrical connection through a passage in a barrier between a first compartment and a second compartment of a housing can include disposing a PCB through a sleeve, coupling a dam to an end of the sleeve and to the PCB, filling at least a portion of the sleeve with a sealing material, allowing the sealing material to cure, uncoupling the dam from the sleeve and the PCB, disposing a first end of the PCB in the first compartment and a second end of the PCB in the second compartment, and sealingly coupling the sleeve to the passage. In at least one embodiment, the PCB can be disposed through a bore of the sleeve. In at least one embodiment, the bore can include a first internal groove that opens towards a first end of the sleeve. In at least one embodiment, the dam can be coupled to a second end of the sleeve and to the PCB. In at least one embodiment, filling the sleeve can include filling at least a portion of the bore, including the first internal groove, with the sealing material. In at least one embodiment, the dam can be uncoupled from the second end of the sleeve and the PCB. In at least one embodiment, the sealing material can include an epoxy, a potting material, an encapsulant, or any combination thereof. In at least one embodiment, a method can include forming a frustoconical seal disposed at least partially within the bore.

In at least one embodiment, the sleeve can include a plurality of internal annular grooves. In at least one embodiment, a method can include filling one or more of the internal annular grooves with the sealing material. In at least one embodiment, the sleeve can have a plurality of internal conical sections. In at least one embodiment, a method can include filling one or more of the plurality of internal conical sections with the sealing material. In at least one embodiment, the sleeve can include an interior annular step adjacent to the first compartment, an interior conical section adjacent to the second compartment, a plurality of internal annular grooves between the step and the conical section, or any combination thereof. In at least one embodiment, a method can include filling one or more of the step, the conical section, and the grooves with the sealing material.

DETAILED DESCRIPTION OF THE INVENTION

Figure 1:
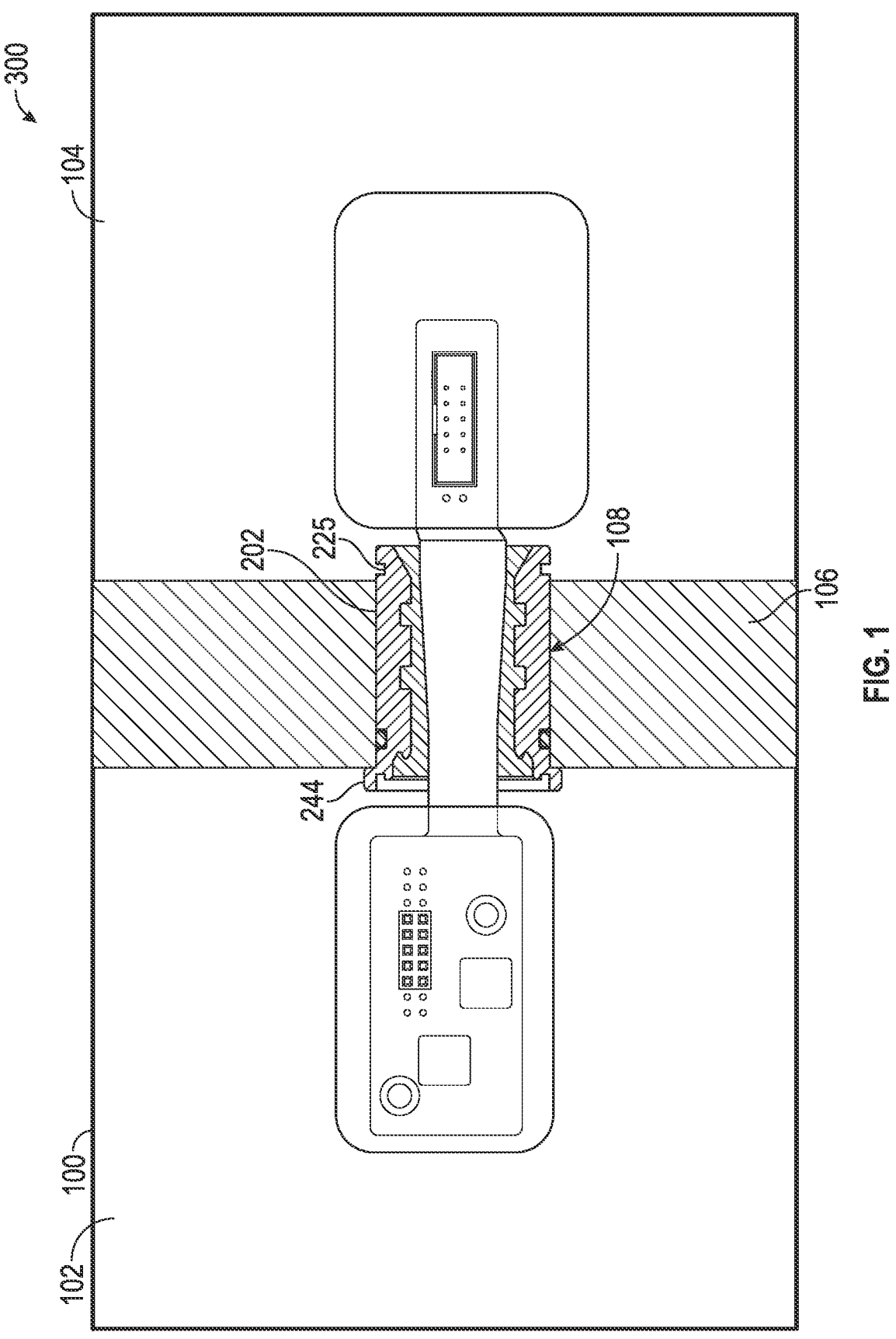
FIG. 1 is a sectional view of one of many embodiments of a feedthrough apparatus coupled to a housing according to the disclosure.

The Figures described above and the written description of specific structures and functions below are not presented to limit the scope of what Applicant has invented or the scope of the appended claims. Rather, the Figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms.

The use of a singular term, such as, but not limited to, "a," is not intended as limiting of the number of items. Also, the use of relational terms, such as, but not limited to, "top," "bottom," "left," "right," "upper," "lower," "down," "up," "side," and the like are used in the written description for clarity in specific reference to the Figures and are not intended to limit the scope of the inventions or the appended claims. The terms "including" and "such as" are illustrative and not limitative. The terms "couple," "coupled," "coupling," "coupler," and like terms are used broadly herein and can include any method or device for securing, binding, bonding, fastening, attaching, joining, inserting therein, forming thereon or therein, communicating, or otherwise associating, for example, mechanically, magnetically, electrically, chemically, operably, directly or indirectly with intermediate elements, one or more pieces of members together and can further include without limitation integrally forming one functional member with another in a unity fashion. The coupling can occur in any direction, including rotationally. Further, all parts and components of the disclosure that are capable of being physically embodied inherently include imaginary and real characteristics regardless of whether such characteristics are expressly described herein, including but not limited to characteristics such as axes, ends, inner and outer surfaces, interior spaces, tops, bottoms, sides, boundaries, dimensions (e.g., height, length, width, thickness), mass, weight, volume and density, among others.

Applicant has created new and useful devices, systems and methods for providing a hermetically sealed electrical connection through a passage in a barrier between compartments or other portions of a housing, such as an actuator housing, a valve controller housing, a digital valve controller (DVC) housing, or another housing for which such a hermetically sealed connection. Embodiments of the disclosure can be utilized, for instance, for sealed connections between hazardous and nonhazardous areas of a DVC housing, including, but not limited to, electrical connections involving a printed circuit board (PCB), which can be or include a printed circuit board assembly (PCBA).

Figure 2:
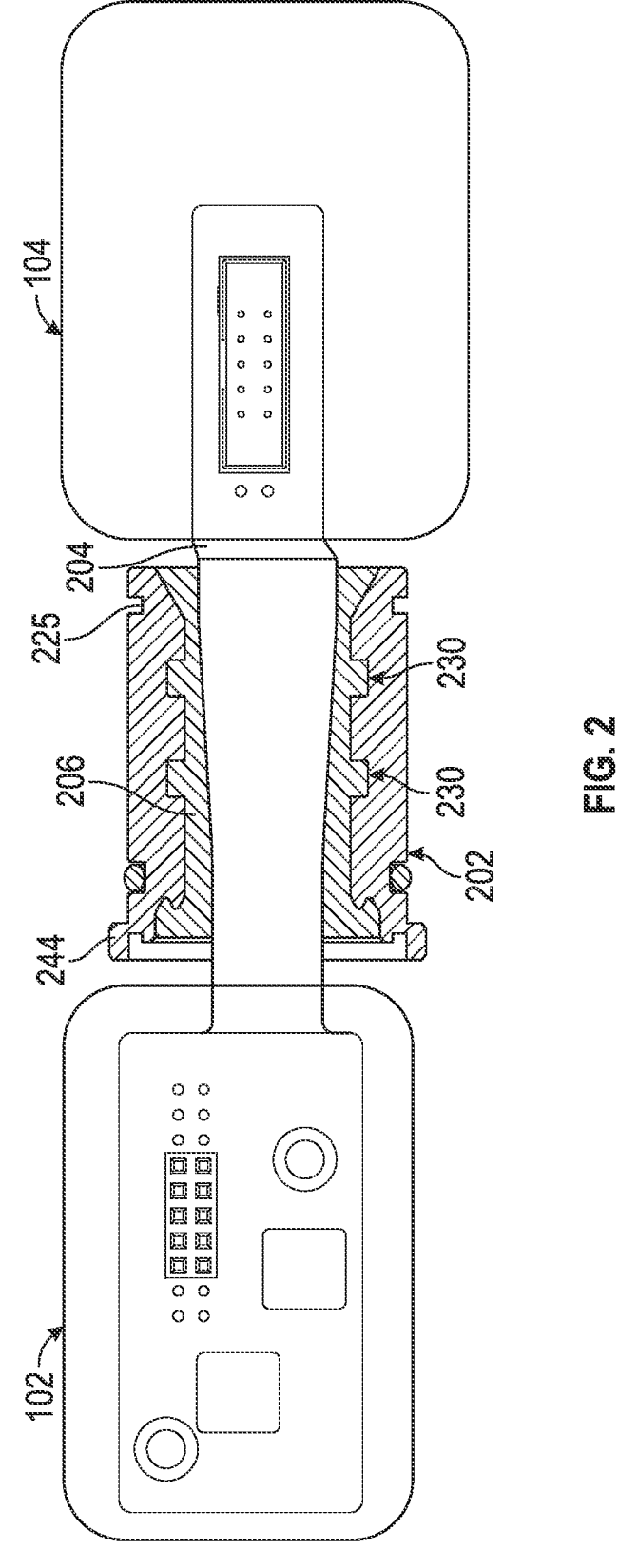
FIG. 2 is a plan sectional view of one of many embodiments of a feedthrough apparatus according to the disclosure.
Figure 3:
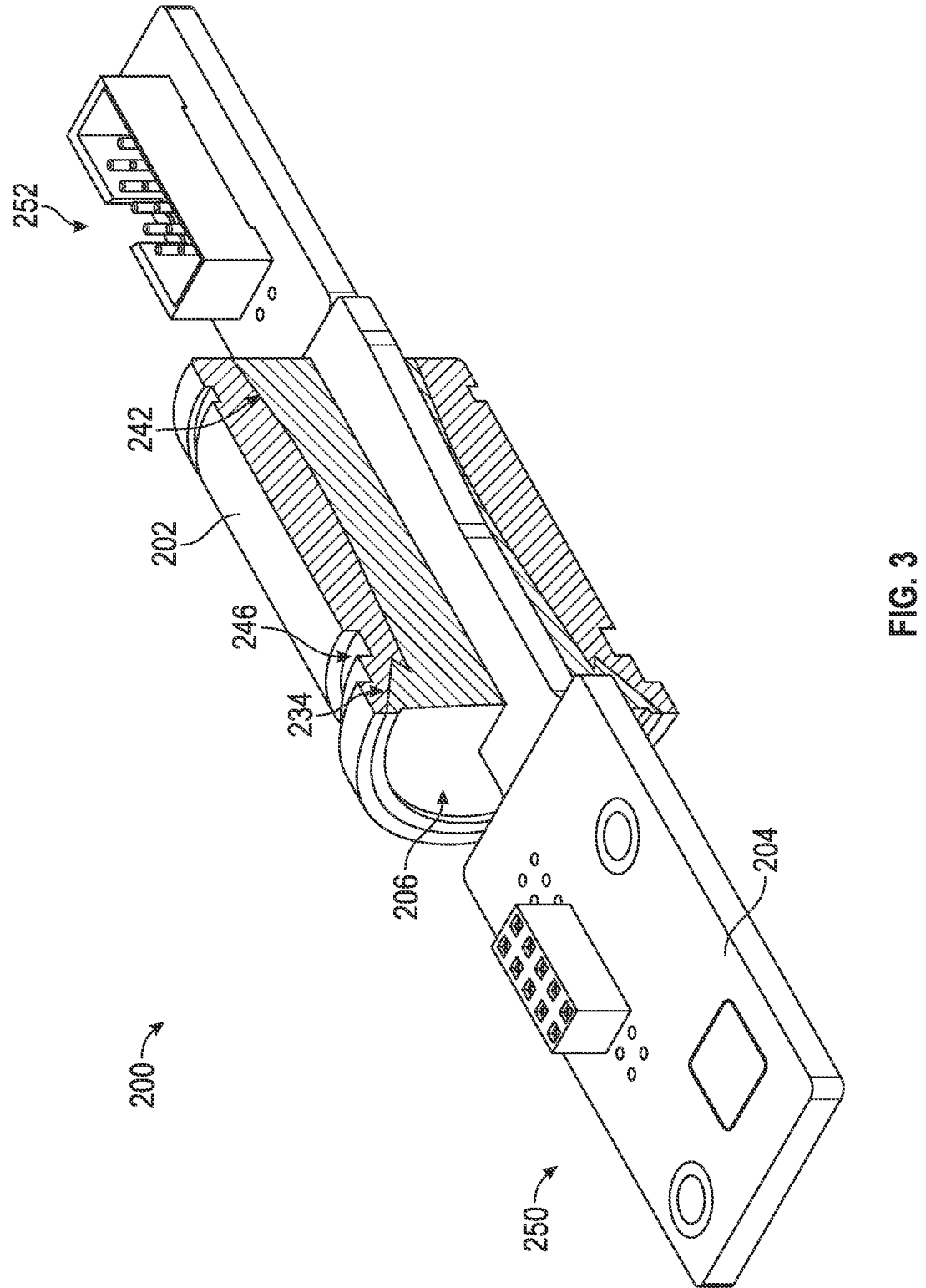
FIG. 3 is a perspective sectional view of one of many embodiments of a feedthrough apparatus according to the disclosure.
Figure 4:
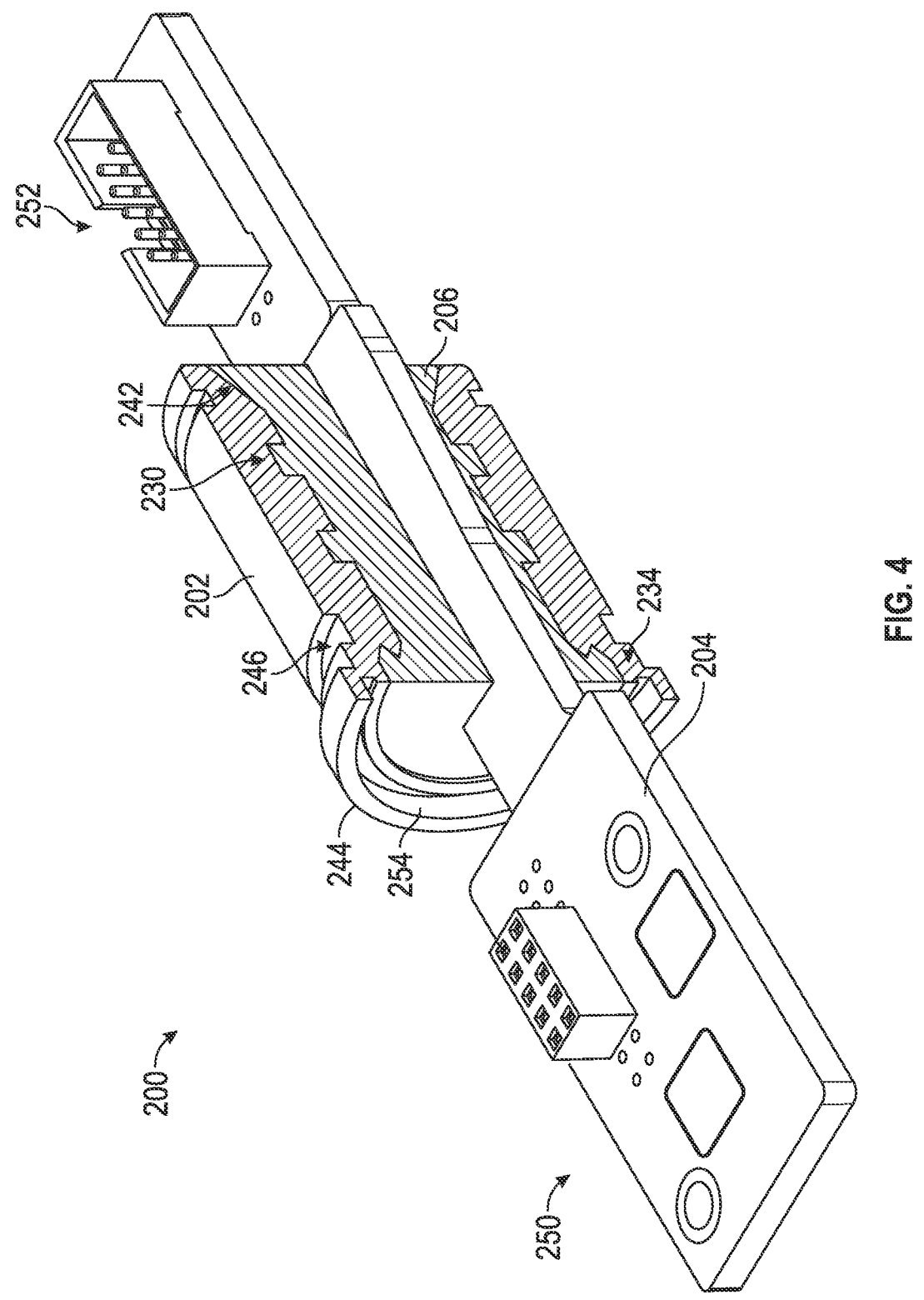
FIG. 4 is a perspective sectional view of another one of many embodiments of a feedthrough apparatus according to the disclosure.
Figure 5:
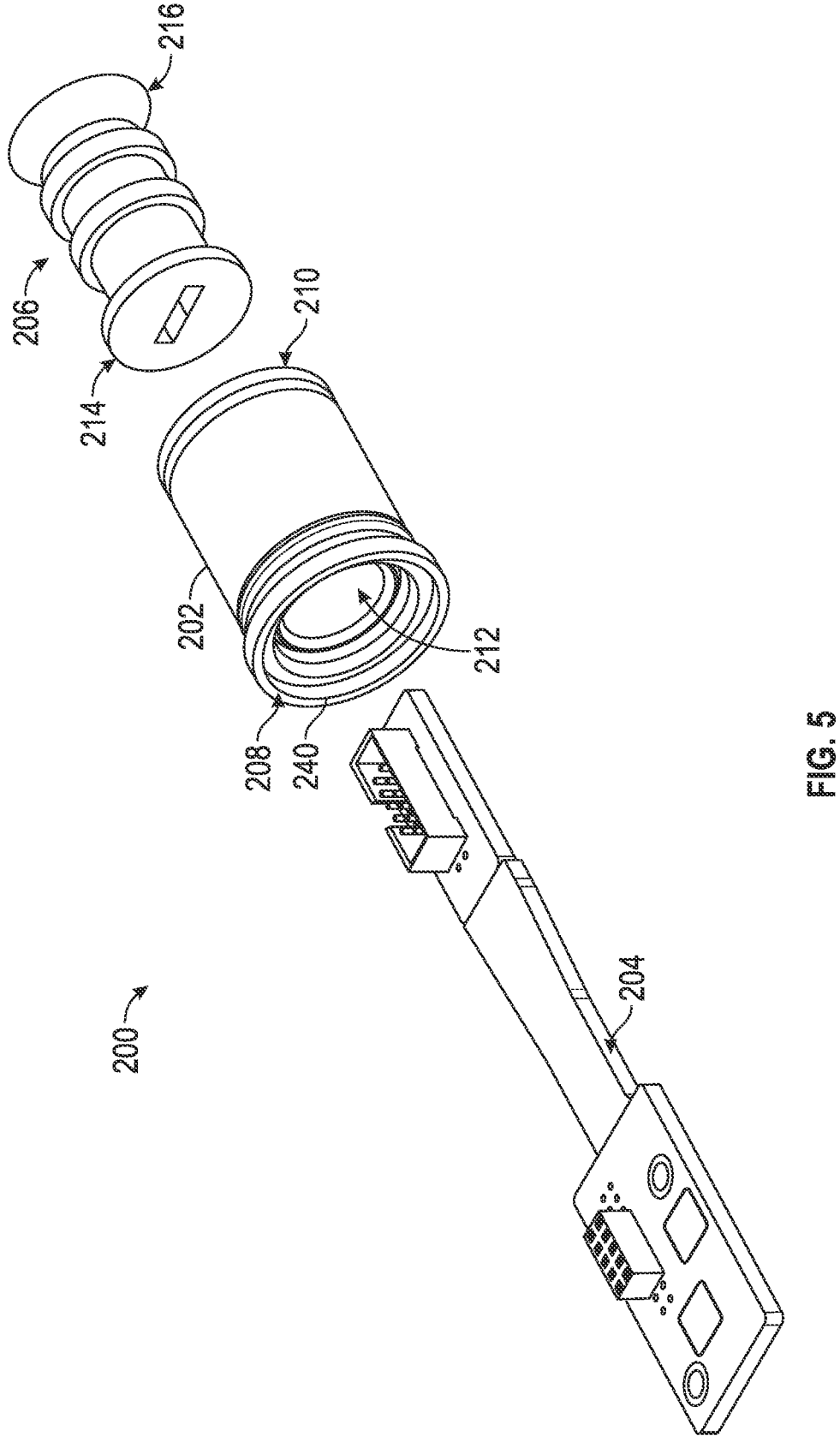
FIG. 5 is a perspective exploded view of the embodiment of FIG. 4.
Figure 6:
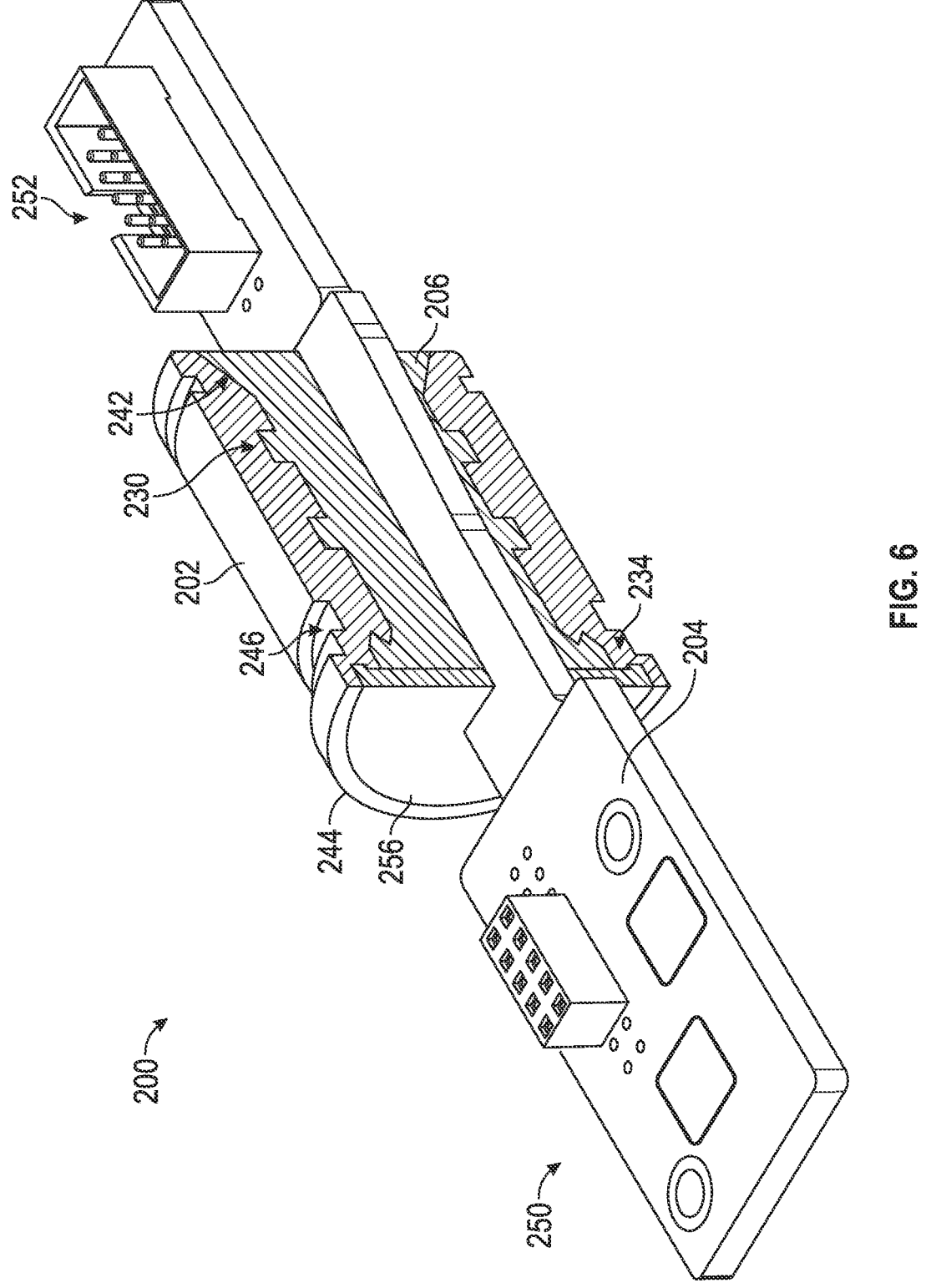
FIG. 6 is a perspective sectional view of yet another one of many embodiments of a feedthrough apparatus according to the disclosure.
Figure 7:
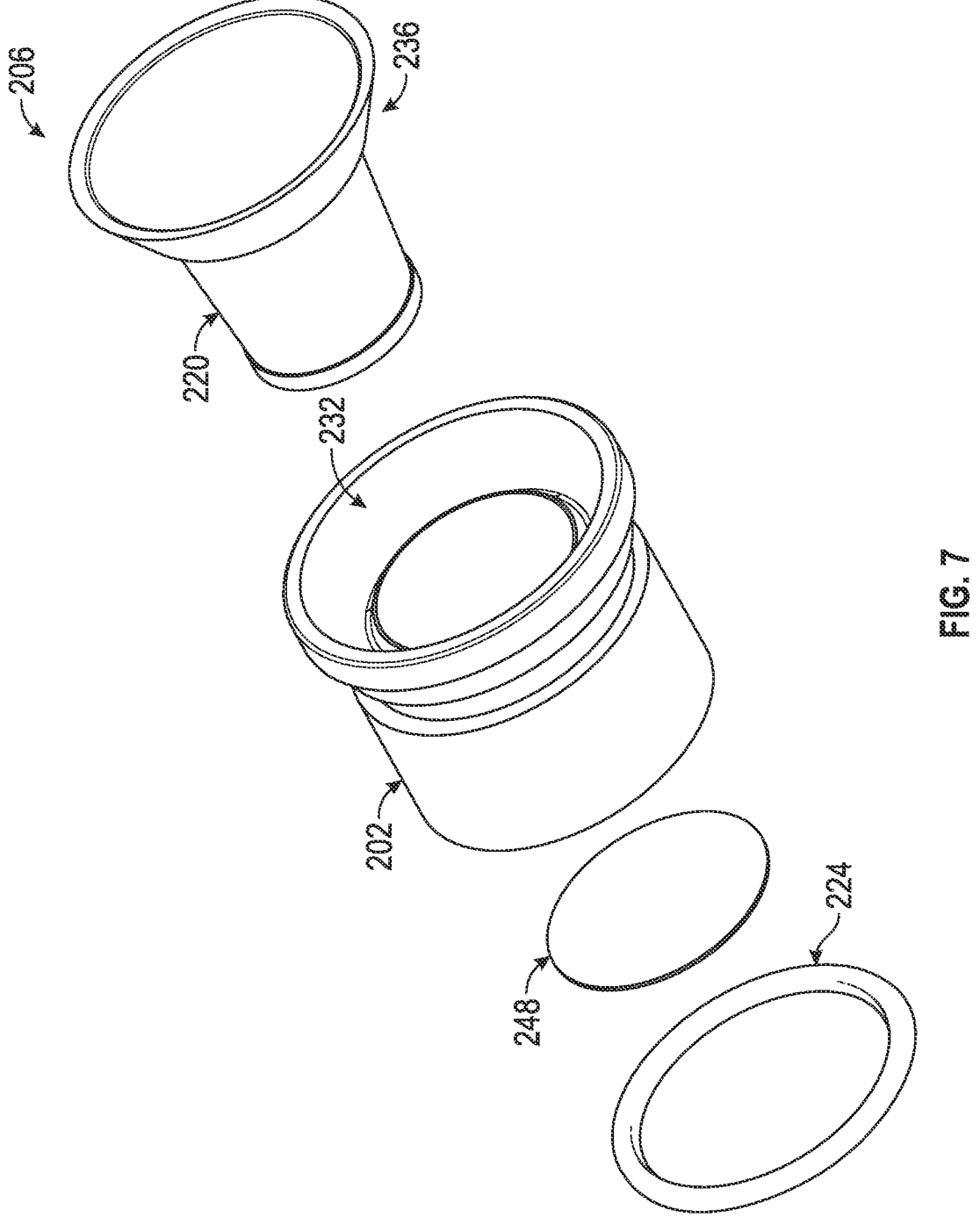
FIG. 7 is a perspective exploded view of one of many embodiments of select components of a feedthrough apparatus according to the disclosure.
Figure 8:
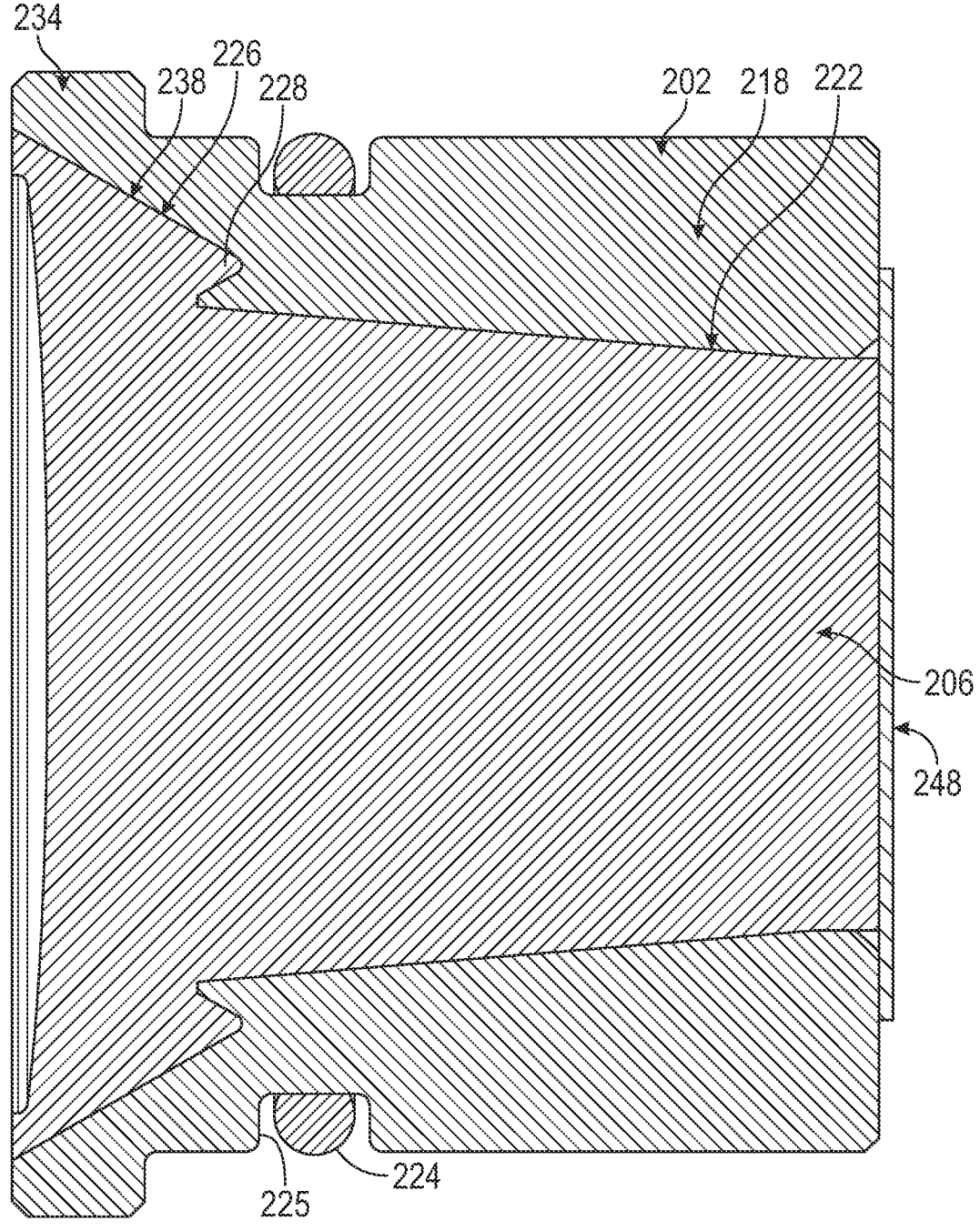
FIG. 8 is a plan sectional view of one of many embodiments of select components of a feedthrough apparatus according to the disclosure.
Figure 9:
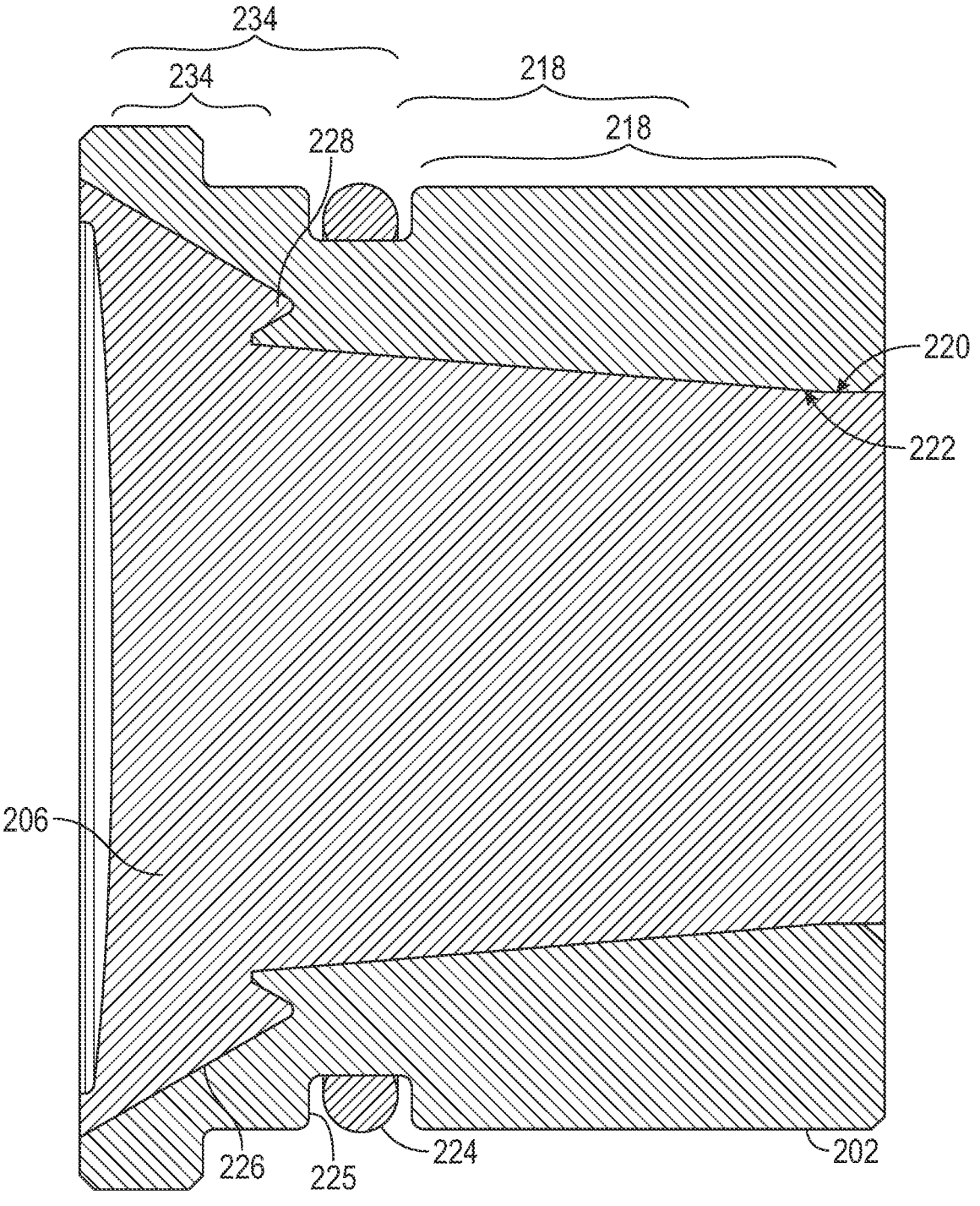
FIG. 9 is another plan sectional view of one of many embodiments of select components of a feedthrough apparatus according to the disclosure.

FIG. 1 is a sectional view of one of many embodiments of a feedthrough apparatus coupled to a housing according to the disclosure. FIG. 2 is a plan sectional view of one of many embodiments of a feedthrough apparatus according to the disclosure. FIG. 3 is a perspective sectional view of one of many embodiments of a feedthrough apparatus according to the disclosure. FIG. 4 is a perspective sectional view of another one of many embodiments of a feedthrough apparatus according to the disclosure. FIG. 5 is a perspective exploded view of the embodiment of FIG. 4. FIG. 6 is a perspective sectional view of yet another one of many embodiments of a feedthrough apparatus according to the disclosure. FIG. 7 is a perspective exploded view of one of many embodiments of select components of a feedthrough apparatus according to the disclosure. FIG. 8 is a plan sectional view of one of many embodiments of select components of a feedthrough apparatus according to the disclosure. FIG. 9 is another plan sectional view of one of many embodiments of select components of a feedthrough apparatus according to the disclosure. FIGS. 1-9 are described in conjunction with one another.

In at least one embodiment, a housing 100, such as a valve controller housing or another housing for supporting one or more components, can include two or more compartments, spaces or internal portions, such as a first compartment 102 and a second compartment 104, with one or more barriers 106 therebetween, such as a wall, separator, divider or other structure for separating two or more areas within housing 100. For example, in at least one embodiment, one of the compartments 102, 104 can be designed to contain explosive materials or events, while the other compartment 102, 104 can be considered relatively safe or insulated from such explosive materials or events. In at least one embodiment, the housing 100 can be or include a housing for a digital valve controller, such as the Fisher™ FIELDVUE™ DVC6200 Digital Valve Controller or the like. In at least one embodiment, the housing 100 can include one or more passages 108 through one or more barriers 106, such as to allow for electrical communication among the first compartment 102 and the second compartment 104 of the housing 100. In some applications, such as those involving explosive materials, a hermetic seal can be desirable between the first compartment 102 and the second compartment 104, along with the electrical communication among the first compartment 102 and the second compartment 104.

In at least one embodiment, a feedthrough apparatus 200 can provide a hermetically sealed electrical connection through a passage 108 in a barrier 106 between a first compartment 102 and a second compartment 104 of a housing 100. In at least one embodiment, a feedthrough apparatus 200 can include a sleeve 202, such as a body or jacket, configured to sealingly couple with the passage 108, a PCB 204 disposed through the sleeve 202 and configured to provide electrical communication among the first compartment 102 and the second compartment 104 of the housing 100, and a seal 206 disposed at least partially within the sleeve 202. In at least one embodiment, the sleeve 202 can include a first end 208, a second end 210 longitudinally opposite the first end 208, and a bore 212 extending there between. In at least one embodiment, the PCB 204 can be disposed through the bore 212 of the sleeve 202. In at least one embodiment, the seal 206 can be disposed within the bore 212 of the sleeve 202. In at least one embodiment, the seal 206 can have a first end 214 configured to be disposed in fluid communication with the first compartment 102 and a second end 216 configured to be disposed in fluid communication with the second compartment 104. In at least one embodiment, the seal 206 can be sealingly coupled to the PCB 204. In at least one embodiment, the feedthrough apparatus 200 can have one or more sealing sections wherein at least a portion of seal 206 can be in sealing engagement with at least a portion of sleeve 202, such as a first sealing section 218, wherein an exterior sealing surface 220 of the seal 206 can be in sealing engagement with an interior sealing surface 222 of the bore 212, and/or one or more additional sealing sections, such as a second (or other) sealing section 234, wherein one or more other sealing surfaces 220 of the seal 206 can be in sealing engagement with one or more other sealing surfaces 222 of the bore 212. In other words, in general, a sealing section of feedthrough apparatus 200 can be or include a portion or section of apparatus 200 along a length of apparatus 200 in or within which at least a portion of seal 206 and sleeve 202 are in sealing engagement with one another.

In at least one embodiment, the sleeve 202, the PCB 204 and the seal 206 can be configured to hermetically seal the passage 108. In at least one embodiment, the sleeve 202 can include one or more gaskets 224, such as an O-ring, for sealing the sleeve 206 to the passage 108 and/or barrier 106. In at least one embodiment, the sleeve 202 can include one or more external groves 225, such as for coupling with one or more gaskets 224 or, as another example, for coupling with one or more retainers (not shown), such as a C-ring or other coupler for retaining or supporting a position of sealing engagement between sleeve 202 and passage 108 and/or barrier 106. In at least one embodiment, the seal 206 can include an epoxy, a potting material, an encapsulant, or any combination thereof. In at least one embodiment, the seal 206 can comprise an epoxy potting material, such as EPOCAPR 42355-52355 Epoxy Encapsulation System, Master Bond Supreme 10AOHT, a similar potting material, or any combination thereof.

In at least one embodiment, the bore 212 can include one or more internal grooves, such as a first internal groove 226 that opens towards the first end of the sleeve 202. In at least one embodiment, the seal 206 can include one or more tongues 228 for sealing coupling with the first internal groove 226. In at least one embodiment, the first internal groove 226 can be or include one or more V grooves. In at least one embodiment, the bore 212 can include one or more internal annular grooves 230 disposed longitudinally between the first internal groove 226 and the second end 210 of the sleeve 206. In at least one embodiment, the seal 206 can sealingly engage each of the one or more internal annular grooves 230.

In at least one embodiment, interior sealing surface 222 of the bore 212, such as in the first sealing section 218 of the sleeve 206, or a portion thereof, can be conical. In at least one embodiment, the seal 206 can conform to the shape of the bore 212. Thus, where a portion of the bore 212 can be conical, the corresponding portion of the seal 206 can also be conical. In at least one embodiment, a larger cross-sectional area of a conical portion of the seal 206 can resist forces, such as an explosive force. Thus, in at least one embodiment, a larger cross-sectional area of a conical portion of the seal 206 (and thus a larger cross-sectional area of a conical portion of the sleeve 202) can be oriented towards a compartment 102, 104 containing explosive materials, events or other pressure, and the shape of the seal 206 and/or sleeve 202 can support containing any explosive forces or other pressure within that compartment 102, 104.

In at least one embodiment, a cross-sectional area of the seal 206 can decrease along the first sealing section 218 in a direction from the first end 214 of the seal 206 to the second end 216 of the seal 206. In at least one embodiment, a cross-sectional area of the bore 212 can decrease along the first sealing section 218 in the direction from the first end 208 of the sleeve 202 to the second end 210 of the sleeve 202. In at least one embodiment, a surface area of the first end 214 of the seal 206 in fluid communication with the first compartment 102 can be larger than a surface area of the second end 216 of the seal 206 in fluid communication with the second compartment 104. In this manner, force or pressure within a compartment of a housing in fluid communication with the relatively larger surface area of first end 214 (or another end, as the case may be) can tend to bias seal 206 towards sealing engagement with one of more other components of the system, such as, for example, sleeve 202 and/or PCB 204.

In at least one embodiment, the first sealing section 218 can be frustoconical. In at least one embodiment, the bore 212 can include a plurality of internal frustoconical sections 232. In at least one embodiment, the seal 206 can sealingly engage one or more of the internal frustoconical sections 232.

In at least one embodiment, the feedthrough apparatus 200 can include a second sealing section 234. In at least one embodiment, a second exterior sealing surface 236 of the seal 206 can be in sealing engagement with a second interior sealing surface 238 of the bore 212. In at least one embodiment, the second sealing section 234 can be disposed between, such as longitudinally between, a first sealing section 218 and the first end 214 of the seal 206. In at least one embodiment, the second sealing section 234 can have a major cross-sectional dimension larger than a major cross-sectional dimension of the first sealing section 218. In at least one embodiment, the second sealing section 234, or a portion thereof, can be frustoconical.

In at least one embodiment, the first end 208 of the sleeve 206 can include an interior annular step 240. In at least one embodiment, the second end 210 of the sleeve 206 can include an interior conical section 242. In at least one embodiment, the bore 212 can include a plurality of internal annular grooves 230 disposed longitudinally between the step 240 and the conical section 242. In at least one embodiment, the seal 206 sealingly engages the step 240, the conical section 242, the grooves 230, or any combination thereof.

In at least one embodiment, the sleeve 202 can be configured to sealingly engage an internal surface of the passage 108 and/or one or more surfaces of the barrier 106. For example, in at least one embodiment, the sleeve 202 can include a flange 244 configured to abut the barrier 106, an external seal groove 246 disposed in an exterior surface of the sleeve 202, an external seal 224 seated in the external seal groove 246, or any combination thereof.

In at least one embodiment, a digital valve controller 300 can include a housing 100 having a first compartment 102, a second compartment 104, a barrier 106 between the first and second compartments 102, 104, and a passage 108 through the barrier 106, and a feedthrough apparatus 200 coupled to the passage 108. In at least one embodiment, the feedthrough apparatus 200 can include a sleeve 202 having a first end 208, a second end 210 longitudinally opposite the first end 208, and a bore 212 extending there between, a PCB 204 disposed through the bore 212 of the sleeve 202 and configured to provide electrical communication among the first compartment 102 and the second compartment 104 of the housing 100, and a seal 206 disposed within the bore 212 of the sleeve 202. In at least one embodiment, the seal 206 can have a first end 214 in fluid communication with the first compartment 102 and a second end 216 in fluid communication with the second compartment 104. In at least one embodiment, the feedthrough apparatus 200 can include a first sealing section 218 with an exterior sealing surface 220 of the seal 206 being in sealing engagement with an interior sealing surface 222 of the bore 212. In at least one embodiment, the sleeve 202 can be sealingly coupled with the passage 108. In at least one embodiment, the seal 206 can be sealingly coupled with the PCB 204. In at least one embodiment, the bore 212 can include a first internal groove 226 that opens towards the first end 208 of the sleeve 202. In at least one embodiment, the seal 206 can include a tongue 228 sealingly coupled to the first internal groove 226. In at least one embodiment, the sleeve 202, the PCB 204 and the seal 206 can hermetically seal the passage 108.

In at least one embodiment, the first internal groove 226 can be a V groove. In at least one embodiment, the bore 212 can have one or more internal annular grooves 230, such as disposed longitudinally between the first internal groove 226 and the second end 210 of the sleeve 202. In at least one embodiment, the seal 206 can sealingly engage one or more of the internal annular grooves 230. In at least one embodiment, the bore 212 can have a plurality of internal frustoconical sections 232. In at least one embodiment, the seal 206 can sealingly engage each one or more of the internal frustoconical sections 230.

In at least one embodiment, the seal 206 can include at least one of an epoxy, a potting material, an encapsulant, or any combination thereof. In at least one embodiment, a surface area of the first end 214 of the seal 206 in fluid communication with the first compartment 102 can be larger than a surface area of the second end 216 of the seal 206 in fluid communication with the second compartment 104.

In at least one embodiment, a cross-sectional area of the seal 206 can decrease along the first sealing section 218 in a direction from the first end 214 of the seal 206 to the second end 216 of the seal 206. In at least one embodiment, a cross-sectional area of the bore 212 can decrease along the first sealing section 218 in the direction from the first end 208 of the sleeve 202 to the second end 210 of the sleeve 202. In at least one embodiment, the first sealing section 218 can be frustoconical.

The feedthrough apparatus 200 can also include a second sealing section 234 wherein a second exterior sealing surface 236 of the seal 206 can be in sealing engagement with a second interior sealing surface 238 of the bore 212. In at least one embodiment, the second sealing section 234 can be disposed between the first sealing section 218 and the first end 214 of the seal 206. In at least one embodiment, the second sealing section 234 can have a major cross-sectional dimension larger than a major cross-sectional dimension of the first sealing section 218. In at least one embodiment, the second sealing section 234, or a portion thereof, can be frustoconical.

In at least one embodiment, the first end 208 of the sleeve 202 can have an interior annular step 240. In at least one embodiment, the second end 210 of the sleeve 202 can have an interior conical section 242. In at least one embodiment, the bore 212 can include a plurality of internal annular grooves 230 disposed longitudinally between the step 240 and the conical section 242. In at least one embodiment, the seal 206 can sealingly engage the step 240, the conical section 242, the grooves 230, or any combination thereof.

In at least one embodiment, the sleeve 202 can include a flange 244 configured to abut the barrier 106, an external seal 246 groove disposed in an exterior surface of the sleeve 202, an external seal 224 seated in the external seal groove 246, or any combination thereof. In at least one embodiment, the sleeve 202 can sealingly engage an internal surface of the passage 108.

In at least one embodiment, a method of providing a hermetically sealed electrical connection through a passage 108 in a barrier 106 between a first compartment 102 and a second compartment 104 of a housing 100 can include disposing a PCB 204 through a sleeve 202, coupling a dam 248 to an end of the sleeve 202 and to the PCB 204, filling at least a portion of the sleeve 202 with a sealing material 206, allowing the sealing material 206 to cure, uncoupling the dam 248 from the sleeve 202 and the PCB 204, disposing a first end 250 of the PCB 204 in the first compartment 102 and a second end 252 of the PCB 204 in the second compartment 104, and sealingly coupling the sleeve 202 to the passage 108. In at least one embodiment, the PCB 204 can be disposed through a bore 212 of the sleeve 202. In at least one embodiment, the bore 212 can include a first internal groove 226 that opens towards a first end 208 of the sleeve 202. In at least one embodiment, the dam 248 can be coupled to a second end 210 of the sleeve 202 and to the PCB 204. In at least one embodiment, filling the sleeve 202 can include filling at least a portion of the bore 212, including the first internal groove 226, with the sealing material 206. In at least one embodiment, the dam 248 can be uncoupled from the second end 210 of the sleeve 202 and the PCB 204. In at least one embodiment, the sealing material 206 can include an epoxy, a potting material, an encapsulant, or any combination thereof. In at least one embodiment, a method can include forming a frustoconical seal disposed at least partially within the bore 212.

In at least one embodiment, the sleeve 202 can include a plurality of internal annular grooves 230. In at least one embodiment, a method can include filling one or more of the internal annular grooves 230 with the sealing material 206. In at least one embodiment, the sleeve 202 can have a plurality of internal conical sections 232. In at least one embodiment, a method can include filling one or more of the internal conical sections 232 with the sealing material 206. In at least one embodiment, the sleeve 202 can include an interior annular step 240 adjacent to the first compartment 102, an interior conical section 242 adjacent to the second compartment 104, a plurality of internal annular grooves 230 between the step 240 and the conical section 242, or any combination thereof. In at least one embodiment, a method can include filling one or more of the step 240, the conical section 242, and the grooves 230 with the sealing material.

In at least one embodiment, the flange 244, or another portion of the sleeve 202, can include an internal lip or ledge 254. In at least one embodiment, the ledge 254 can be on or near the first end 208 and/or the second end 210 of the sleeve 202. In at least one embodiment, a portion of the sleeve 202, such as the space circumscribed by the flange 244 and/or the ledge 254, can contain a sealing material 256. In at least one embodiment, the sealing material 256 can comprise an epoxy potting material, such as EPOCAP® 42355-52355 Epoxy Encapsulation System, Master Bond Supreme 10AOHT, a similar potting material, or any combination thereof. In at least one embodiment, the seal 206 can be made from the sealing material 256. In at least one embodiment, the seal 206 can be made from a different material than the sealing material 256. In at least one embodiment, the seal 206 can be designed to contain explosive forces and/or the sealing material 256 can be configured to form a gas tight seal, such as to assure that no explosive gases on one side of the feedthrough apparatus 200, or barrier 106, reach the other side.

In at least one embodiment, a feedthrough apparatus, such as for a passage through a barrier between a first compartment and a second compartment of a housing, can include a sleeve configured to sealingly couple with the passage, a printed circuit board (PCB) disposed through the sleeve and configured to provide electrical communication among the first compartment and the second compartment of the housing, and a seal disposed within the sleeve. In at least one embodiment, the sleeve can include a first end, a second end longitudinally opposite the first end, and a bore extending there between. In at least one embodiment, the PCB can be disposed through the bore of the sleeve. In at least one embodiment, the seal can be disposed within the bore of the sleeve. In at least one embodiment, the seal can have a first end configured to be disposed in fluid communication with the first compartment and a second end configured to be disposed in fluid communication with the second compartment. In at least one embodiment, the seal can be sealingly coupled to the PCB. In at least one embodiment, the feedthrough apparatus can have a first sealing section, wherein an exterior sealing surface of the seal can be in sealing engagement with an interior sealing surface of the bore.

In at least one embodiment, the sleeve, the PCB and the seal can be configured to hermetically seal the passage. In at least one embodiment, the seal can include an epoxy, a potting material, an encapsulant, or any combination thereof.

In at least one embodiment, the bore can include a first internal groove that opens towards the first end of the sleeve. In at least one embodiment, the seal can include a tongue sealingly coupled to the first internal groove. In at least one embodiment, the first internal groove can be a V groove. In at least one embodiment, the bore can include one or more internal annular grooves disposed longitudinally between the first internal groove and the second end of the sleeve. In at least one embodiment, the seal can sealingly engage one or more of the internal annular grooves.

In at least one embodiment, a cross-sectional area of the seal can decrease along the first sealing section in a direction from the first end of the seal to the second end of the seal. In at least one embodiment, a cross-sectional area of the bore can decrease along the first sealing section in the direction from the first end of the sleeve to the second end of the sleeve. In at least one embodiment, a surface area of the first end of the seal in fluid communication with the first compartment can be larger than a surface area of the second end of the seal in fluid communication with the second compartment.

In at least one embodiment, the first sealing section can be frustoconical. In at least one embodiment, the bore can include a plurality of internal frustoconical sections. In at least one embodiment, wherein the seal can sealingly engage one or more of the internal frustoconical sections.

In at least one embodiment, the feedthrough apparatus can also include a second sealing section. In at least one embodiment, a second exterior sealing surface of the seal can be in sealing engagement with a second interior sealing surface of the bore. In at least one embodiment, the second sealing section can be disposed between the first sealing section and the first end of the seal. In at least one embodiment, the second sealing section can have a major cross-sectional dimension larger than a major cross-sectional dimension of the first sealing section. In at least one embodiment, the second sealing section, or a portion thereof, can be frusto-conical.

In at least one embodiment, the first end of the sleeve can include an interior annular step. In at least one embodiment, the second end of the sleeve can include an interior conical section. In at least one embodiment, the bore can include a plurality of internal annular grooves disposed longitudinally between the step and the conical section. In at least one embodiment, the seal can sealingly engage the step, the conical section, the grooves, or any combination thereof.

In at least one embodiment, the sleeve can include a flange configured to abut the barrier, an external seal groove disposed in an exterior surface of the sleeve, an external seal seated in the external seal groove, or any combination thereof. In at least one embodiment, the sleeve can be configured to sealingly engage an internal surface of the passage.

In at least one embodiment, a digital valve controller can include a housing having a first compartment, a second compartment, a barrier between the first and second compartments, and a passage through the barrier, and a feedthrough apparatus coupled to the passage. In at least one embodiment, the feedthrough apparatus can include a sleeve having a first end, a second end longitudinally opposite the first end, and a bore extending there between, a printed circuit board (PCB) disposed through the bore of the sleeve and configured to provide electrical communication among the first compartment and the second compartment of the housing, and a seal disposed within the bore of the sleeve. In at least one embodiment, the seal can have a first end in fluid communication with the first compartment and a second end in fluid communication with the second compartment. In at least one embodiment, the feedthrough apparatus can include a first sealing section with an exterior sealing surface of the seal being in sealing engagement with an interior sealing surface of the bore. In at least one embodiment, the sleeve can be sealingly coupled with the passage. In at least one embodiment, the seal can be sealingly coupled with the PCB. In at least one embodiment, the bore can include a first internal groove that opens towards the first end of the sleeve. In at least one embodiment, the seal can include a tongue sealingly coupled to the first internal groove. In at least one embodiment, the sleeve, the PCB and the seal can hermetically seal the passage.

In at least one embodiment, the first internal groove can be a V groove. In at least one embodiment, the bore can have one or more internal annular grooves, such as disposed longitudinally between the first internal groove and the second end of the sleeve. In at least one embodiment, the seal can sealingly engage one or more of the internal annular grooves. In at least one embodiment, the bore can have one or more internal frustoconical sections. In at least one embodiment, the seal can sealingly engage one or more of the internal frustoconical sections.

In at least one embodiment, the seal can include at least one of an epoxy, a potting material, an encapsulant, or any combination thereof. In at least one embodiment, a surface area of the first end of the seal in fluid communication with the first compartment can be larger than a surface area of the second end of the seal in fluid communication with the second compartment.

In at least one embodiment, a cross-sectional area of the seal can decrease along the first sealing section in a direction from the first end of the seal to the second end of the seal. In at least one embodiment, a cross-sectional area of the bore can decrease along the first sealing section in the direction from the first end of the sleeve to the second end of the sleeve. In at least one embodiment, the first sealing section can be frustoconical.

The feedthrough apparatus can also include a second sealing section wherein a second exterior sealing surface of the seal can be in sealing engagement with a second interior sealing surface of the bore. In at least one embodiment, the second sealing section can be disposed between the first sealing section and the first end of the seal. In at least one embodiment, the second sealing section can have a major cross-sectional dimension larger than a major cross-sectional dimension of the first sealing section. In at least one embodiment, the second sealing section, or a portion thereof, can be frustoconical.

In at least one embodiment, the first end of the sleeve can have an interior annular step. In at least one embodiment, the second end of the sleeve can have an interior conical section. In at least one embodiment, the bore can include a plurality of internal annular grooves disposed longitudinally between the step and the conical section. In at least one embodiment, the seal can sealingly engage the step, the conical section, the grooves, or any combination thereof.

In at least one embodiment, the sleeve can include a flange configured to abut the barrier, an external seal groove disposed in an exterior surface of the sleeve, an external seal seated in the external seal groove, or any combination thereof. In at least one embodiment, the sleeve can sealingly engage an internal surface of the passage.

In at least one embodiment, a method of providing a hermetically sealed electrical connection through a passage in a barrier between a first compartment and a second compartment of a housing can include disposing a printed circuit board (PCB) through a sleeve, coupling a dam to an end of the sleeve and to the PCB, filling at least a portion of the sleeve with a sealing material, allowing the sealing material to cure, uncoupling the dam from the sleeve and the PCB, disposing a first end of the PCB in the first compartment and a second end of the PCB in the second compartment, and sealingly coupling the sleeve to the passage. In at least one embodiment, the PCB can be disposed through a bore of the sleeve. In at least one embodiment, the bore can include a first internal groove that opens towards a first end of the sleeve. In at least one embodiment, the dam can be coupled to, and/or uncoupled from, a second end of the sleeve and to the PCB. In at least one embodiment, filling the sleeve can include filling at least a portion of the bore, including the first internal groove, with the sealing material. In at least one embodiment, the sealing material can include an epoxy, a potting material, an encapsulant, or any combination thereof. In at least one embodiment, a method can include forming a frustoconical seal disposed at least partially within the bore.

In at least one embodiment, the sleeve can include one or more internal annular grooves. In at least one embodiment, a method can include filling one or more of the internal annular grooves with the sealing material. In at least one embodiment, the sleeve can have one or more internal conical sections. In at least one embodiment, a method can include filling one or more of the internal conical sections with the sealing material. In at least one embodiment, the sleeve can include an interior annular step adjacent to the first compartment, an interior conical section adjacent to the second compartment, a plurality of internal annular grooves between the step and the conical section, or any combination thereof. In at least one embodiment, a method can include filling one or more of the step, the conical section, and the grooves with the sealing material.

Other and further embodiments utilizing one or more aspects of the disclosure can be devised without departing from the spirit of Applicant's disclosure. For example, the devices, systems and methods can be implemented for numerous different types and sizes in numerous different industries. Further, the various methods and embodiments of the devices, systems and methods can be included in combination with each other to produce variations of the disclosed methods and embodiments. Discussion of singular elements can include plural elements and vice versa. The order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

The inventions have been described in the context of preferred and other embodiments and not every embodiment of the inventions has been described. Obvious modifications and alterations to the described embodiments are available to those of ordinary skill in the art having the benefits of the present disclosure. The disclosed and undisclosed embodiments are not intended to limit or restrict the scope or applicability of the inventions conceived of by the Applicant, but rather, in conformity with the patent laws, Applicant intends to fully protect all such modifications and improvements that come within the scope or range of equivalents of the following claims.

What is claimed is:

1. A feedthrough apparatus for a passage through a barrier between a first compartment and a second compartment of a housing, the feedthrough apparatus comprising:
    a sleeve having a first end, a second end longitudinally opposite the first end, and a bore extending there between, wherein the sleeve is configured to sealingly couple with the passage;
    a printed circuit board (PCB) disposed through the bore of the sleeve and configured to provide electrical communication among the first compartment and the second compartment of the housing; and
    a seal disposed within the bore of the sleeve, wherein the seal has a first end configured to be disposed in fluid communication with the first compartment and a second end configured to be disposed in fluid communication with the second compartment;
    wherein the seal is sealingly coupled to the PCB;
    wherein the feedthrough apparatus has a first sealing section wherein an exterior sealing surface of the seal is in sealing engagement with an interior sealing surface of the bore;
    wherein the bore comprises a first internal groove that opens towards the first end of the sleeve;
    wherein the seal comprises a tongue sealingly coupled to the first internal groove; and
    wherein the sleeve, the PCB and the seal are configured to hermetically seal the passage.

2. The feedthrough apparatus of claim 1, wherein the first internal groove is a V groove.

3. The feedthrough apparatus of claim 1, wherein the seal comprises at least one of an epoxy, a potting material, an encapsulant, and a combination thereof.

4. The feedthrough apparatus of claim 1, wherein a cross-sectional area of the seal decreases along the first sealing section in a direction from the first end of the seal to the second end of the seal, and wherein a cross-sectional area of the bore decreases along the first sealing section in the direction from the first end of the sleeve to the second end of the sleeve.

5. The feedthrough apparatus of claim 1, wherein a surface area of the first end of the seal in fluid communication with the first compartment is larger than a surface area of the second end of the seal in fluid communication with the second compartment.

6. The feedthrough apparatus of claim 1, further comprising a second sealing section wherein a second exterior sealing surface of the seal is in sealing engagement with a second interior sealing surface of the bore, wherein the second sealing section is disposed between the first sealing section and the first end of the seal, and wherein the second sealing section has a major cross-sectional dimension larger than a major cross-sectional dimension of the first sealing section.

7. The feedthrough apparatus of claim 6, wherein at least a portion of one or more of the first sealing section and the second sealing section is frustoconical.

8. The feedthrough apparatus of claim 1, wherein the bore includes one or more internal annular grooves disposed longitudinally between the first internal groove and the second end of the sleeve, and wherein the seal sealingly engages each of the one or more internal annular grooves.

9. The feedthrough apparatus of claim 1, wherein the bore includes a plurality of internal frustoconical sections, and wherein the seal sealingly engages each of the plurality of internal frustoconical sections.

10. The feedthrough apparatus of claim 1, wherein the first end of the sleeve includes an interior annular step, wherein the second end of the sleeve includes an interior conical section, wherein the bore comprises a plurality of internal annular grooves disposed longitudinally between the step and the conical section, and wherein the seal sealingly engages the step, the conical section, and the grooves.

11. The feedthrough apparatus of claim 1, wherein the sleeve comprises a flange configured to abut the barrier, an external seal groove disposed in an exterior surface of the sleeve, and an external seal seated in the external seal groove and configured to sealingly engage an internal surface of the passage.

12. A digital valve controller, comprising:
a housing having a first compartment, a second compartment, a barrier between the first and second compartments, and a passage through the barrier; and
a feedthrough apparatus coupled to the passage, wherein the feedthrough apparatus comprises
a sleeve having a first end, a second end longitudinally opposite the first end, and a bore extending there between;
a printed circuit board (PCB) disposed through the bore of the sleeve and configured to provide electrical communication among the first compartment and the second compartment of the housing;
a seal disposed within the bore of the sleeve, wherein the seal has a first end in fluid communication with the first compartment and a second end in fluid communication with the second compartment; and a first sealing section wherein an exterior sealing surface of the seal is in sealing engagement with an interior sealing surface of the bore;
wherein the sleeve is sealingly coupled with the passage;
wherein the seal is sealingly coupled with the PCB;
wherein the bore comprises a first internal groove that opens towards the first end of the sleeve;
wherein the seal comprises a tongue sealingly coupled to the first internal groove; and
wherein the sleeve, the PCB and the seal hermetically seal the passage.

13. The digital valve controller of claim 12, wherein the first internal groove is a V groove, wherein a cross-sectional area of the seal decreases along the first sealing section in a direction from the first end of the seal to the second end of the seal, and wherein a cross-sectional area of the bore decreases along the first sealing section in the direction from the first end of the sleeve to the second end of the sleeve.

14. The digital valve controller of claim 12, wherein a surface area of the first end of the seal in fluid communication with the first compartment is larger than a surface area of the second end of the seal in fluid communication with the second compartment.

15. The digital valve controller of claim 12, further comprising a second sealing section wherein a second exterior sealing surface of the seal is in sealing engagement with a second interior sealing surface of the bore, wherein the second sealing section is disposed between the first sealing section and the first end of the seal, and wherein the second sealing section has a major cross-sectional dimension larger than a major cross-sectional dimension of the first sealing section.

16. The digital valve controller of claim 15, wherein at least a portion of one or more of the first sealing section and the second sealing section is frustoconical.

17. The digital valve controller of claim 12, wherein the bore includes one or more internal annular grooves disposed longitudinally between the first internal groove and the second end of the sleeve, and wherein the seal sealingly engages each of the one or more internal annular grooves.

18. The digital valve controller of claim 12, wherein the bore includes a plurality of internal frustoconical sections, and wherein the seal sealingly engages each of the plurality of internal frustoconical sections.

19. The digital valve controller of claim 12, wherein the first end of the sleeve includes an interior annular step, wherein the second end of the sleeve includes an interior conical section, wherein the bore comprises a plurality of internal annular grooves disposed longitudinally between the step and the conical section, and wherein the seal sealingly engages the step, the conical section, and the grooves.

20. The digital valve controller of claim 12, wherein the sleeve comprises a flange configured to abut the barrier, an external seal groove disposed in an exterior surface of the sleeve, and an external seal seated in the external seal groove and configured to sealingly engage an internal surface of the passage.

* * * * *